(12) United States Patent
Beilis et al.

(10) Patent No.: US 6,391,164 B1
(45) Date of Patent: May 21, 2002

(54) DEPOSITION OF COATINGS AND THIN FILMS USING A VACUUM ARC WITH A NON-CONSUMABLE HOT ANODE

(76) Inventors: Isak I. Beilis, Rehov Einstein 30/26, Lod (IL), 71362; Raymond L Boxman, Rehov Tchernichernichovsky 25; Samuel Goldsmith, Rehov Tchernichovsky 25, both of Herzliya (IL), 46291; Michael Keidar, 15030 Sutherland, Oak Park, MI (US) 48237; Hanan Rosenthal, Rehov Usha 3, Tel-Aviv (IL), 69392

( * ) Notice: Subject to any disclaimer, the term of this patent is extended or adjusted under 35 U.S.C. 154(b) by 0 days.

(21) Appl. No.: 09/603,432

(22) Filed: Jun. 23, 2000

(51) Int. Cl.$^7$ .............................................. C23C 14/34
(52) U.S. Cl. ............................... 204/192.38; 204/298.41
(58) Field of Search ......................... 204/192.38, 298.41

(56) References Cited

U.S. PATENT DOCUMENTS

| | | | | |
|---|---|---|---|---|
| 5,178,739 A | * | 1/1993 | Barnes et al. | 204/192.12 |
| 5,279,723 A | * | 1/1994 | Falabella et al. | 204/192.38 |
| 5,503,725 A | * | 4/1996 | Sablev et al. | 204/192.12 |
| 5,656,091 A | * | 8/1997 | Lee et al. | 118/723 EB |

\* cited by examiner

Primary Examiner—Nam Nguyen
Assistant Examiner—Steven H. VerSteeg

(57) ABSTRACT

A process and apparatus for depositing thin films and coatings using a vacuum arc plasma source having hot, non-consumable anode is described. Plasma and macroparticles of the cathode material are emitted from the cathode. Part of this material arrives at the hot refractory anode, where it is re-evaporated without macroparticle generation. Substrates exposed to the vapor flow from the anode, but shielded from a direct line of sight with the cathode, are coated with cathode material without macroparticle inclusions.

25 Claims, 7 Drawing Sheets

DEPOSITION OF COATINGS AND THIN FILMS USING A VACUUM ARC WITH A NON-CONSUMABLE HOT ANODE

TECHNICAL FIELD

The present invention concerns the preparation of coatings thin films, which can be used to protect their substrates from wear and corrosion, for functional electronic and optical applications, and for decorative purposes.

BACKGROUND OF THE INVENTION

Coatings and thin films have many technical applications including protecting surfaces from wear and corrosion, providing optical and electronic functions, and improving the appearance of components. Many methods are commonly used, including in particular the family of methods known as physical vapor deposition (PVD), which includes such methods as sputtering, thermal evaporation, and ion plating. One PVD method, known variously as vacuum arc deposition (VAD) or cathodic arc deposition, was introduced in the late $19^{th}$ century by A. Wright, and T. A. Edison (U.S. Pat. No. 484,582, 1892), and more recently by Wroe (U.S. Pat. No. 2,972,695, 1961), Kikuchi et al. (Japan J. Appl. Phys. 4, 940, 1965), Snaper (U.S. Pat. No. 3,625,848, 1971), and Sablev et al. (U.S. Pat. Nos. 3,793,179 and 3,783,231, 1974). In its most common form a high current electrical discharge is maintained within a vacuum vessel between a source cathode and a passive anode. A natural concentration of current at the minute areas of the cathode, known as cathode spots, causes intense melting, evaporation and ionization of the cathode material, producing an energetic plasma beam, which upon impinging on a solid surface will generally form a coating of the cathode material. The reaction force of the plasma jet on the minute liquid pool of the cathode also produces a spray of microscopic liquid droplets, which may contaminate the coating. In some applications the inclusion of these droplets, known as macroparticles (MPs), is tolerable. For other applications, Aksenov (Pribory I Teknika Eksperimenta, No. 5, 236, 1978) has shown how to filter the droplets from the plasma stream by using a magnetic field to guide the plasma beam around an obstruction, such as a quarter torus duct, which prevents line of sight contact between the cathode spots and the substrate. Generally, a significant portion of the plasma generated by the cathode spots is lost in this procedure. Sanders (J. Vac. Sci. Technol A6, 1929–1933, 1987) produced a MP-free vapor by using a cathode spot plasma source to bombard a target of the same material as the cathode with energetic ions, and then utilizing the material sputtered from this target to form a coating. Generally, the electrodes used in cathode spot arcs do not reach a high temperature, except locally at the cathode spots. Typically the electrodes are either cooled, or operated with short pulses, to prevent excessive heating.

A different form of vacuum arc was introduced by Dorodnov et al. (Sov. Tech. Phys. Left. 5, 418–9, 1979; Sov. Phys. Tech. Phys. 26, 304–315, 1981) and Vassin et al. (Sov. Tech. Phys. Lett. 5, 634, 1979), in which either the anode or the cathode is thermally isolated, and thus during arcing reaches a sufficiently high temperature so that significant evaporation occurs over a large portion of its active surface. This vapor may dominate the arc, and according to Dorodnov, under certain circumstances, namely when the vapor pressure is greater than 10 Torr, the cathode spots may extinguish, and with it the production of MPs. Thus, what we call the hot electrode vacuum arc (HEVA) can serve as an efficient coating source without MP contamination. Ehrich et al. (Proc. $8^{th}$ Int. Conf. On Gas Discharges and Their Applications, September 1985, Oxford, p. 596) teaches another hot anode vacuum arc (HAVA) source in which the cathode spots do not extinguish. Ehrich overcomes the problem of MP contamination by the use of shields and a judicious choice of substrate location, so that there is a line of sight between the hot anode and the substrates, but no line of sight between the cathode and the substrates. While solving the MP problem, the various HEVA sources have several disadvantages with respect to cathodic arc sources. The most serious is that usually the evaporating material from the hot anode is generally molten (with the exception of some materials (e.g. Cr) for which significant sublimation occurs below the melting point.). The presence of large quantities of molten material must typically be held upright in some form of cup or crucible. This limits the orientation of the hot electrode, and often metallurgical interactions between the molten source material and the crucible/electrode material can limit the life of the hot electrode and contaminate the coating. Furthermore, different evaporation rates can effectively prevent coating with alloy materials from a single source.

SUMMARY OF THE INVENTION

The present invention relates to a new method and apparatus for depositing coatings and thin films, which uses a vacuum arc sustained between a consumable cathode and a non-consumable hot anode. Material is evaporated from the consumable cathode. During the beginning of the arc, the anode, constructed from a refractory material, is heated to a sufficiently high temperature that any material reaching it will be quickly re-evaporated. In one embodiment, an operating mode is established in which copious quantities of cathode vapor is emitted without MP emission, or with reduced MP emission. In another embodiment, the hot anode also serves as an obstacle blocking MPs from alighting on the substrate, while pressure gradients or magnetic fields guide the vapor around the anodic obstacle towards the substrates. Substrates intercepting this vapor are coated without MP contamination.

BRIEF DESCRIPTION OF THE DRAWINGS

Reference now is made to the accompanying drawings in which.

DETAILED DESCRIPTION OF THE INVENTION

Figure 1:
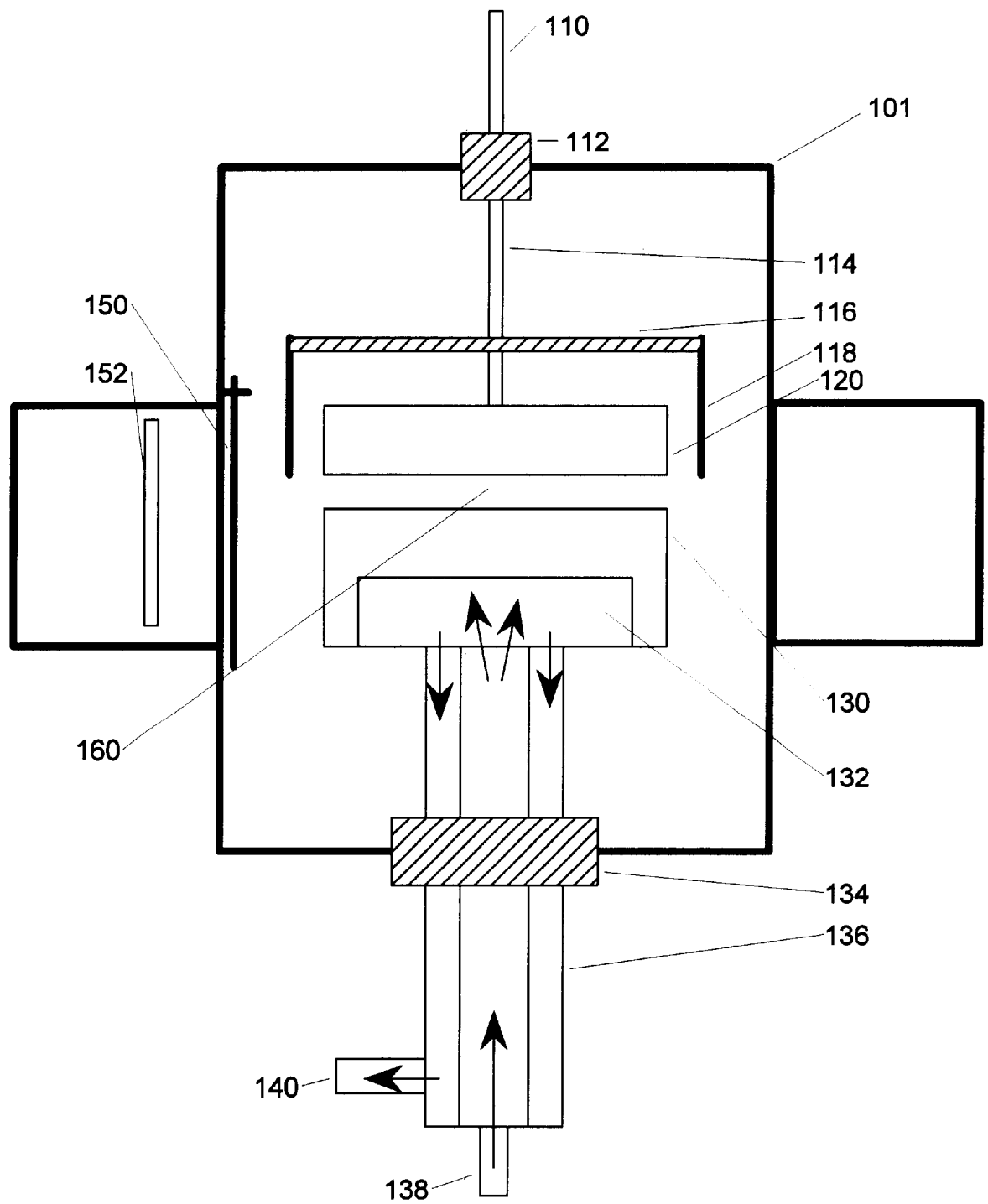
FIG. 1 is a schematic illustration of the apparatus according to this invention.

In FIG. 1, the general method of the present invention is schematically illustrated. An electrical arc is ignited between a cooled source cathode 130, and a non-consumable thermally isolated anode 120. The cathode is preferably cooled by a flow of water to its back side. This may be provided via a hollow cavity 132 within the cathode 130. The cavity is supplied by a flow of water via the coaxial pipe 136 having a water inlet 138 and a water outlet 140. The arrows within 136 and 132 show the general direction of the water flow in one preferred embodiment. In another preferred embodiment of the invention, the cathode may be in the form of a cup constructed of one material, into which a second material is cast and allowed to solidify in a preparatory step prior to arcing.

The anode 120 is constructed from a refractory material. In a preferred embodiment, the anode is constructed from graphite. The anode is mechanically supported by a thin rod 114, which also provides the electrical connection between the anode and the rest of the arc circuit. This rod must be able to withstand the anode temperature where it contacts the anode. In a preferred embodiment rod 114 was constructed from tungsten. In a preferred embodiment, heat loss by radiation is reduced by surrounding the anode by a heat reflector 118. In some embodiments, two or more heat reflectors are provided to further reduce the radiative heat loss. Insulating plate 116 both serves as a heat reflector for the top surface of the anode, and insulates the heat reflector 118 from the anode circuit.

The structures 110 and 136 which respectively provide mechanical support and electrical connection to the anode and cathode are electrically insulated from the vacuum chamber 101 by insulated feedthroughs, 112 and 134. Structures 110 and 136 are connected respectively to the positive and negative poles of a current source, which is not shown. In a preferred embodiment a low voltage current source, such as an arc welder, is employed. Some conventional means must be employed to initiate the arc, as the breakdown voltage in vacuum is very high. Conventional means for igniting the arc include imposing a pulse of high voltage between the anode and the electrode, momentarily touching the electrodes and drawing them apart, touching the cathode momentarily with a trigger electrode which initially is at anode potential, imposing a high voltage pulse to a stationary trigger electrode which is separated from the cathode or anode by an insulator and causing a surface flashover, or irradiating one of the electrodes with a laser pulse. Means of initiating the arc are not shown in FIG. 1 to preserve clarity.

Initially the arc will operate in the normal cathode spot mode, producing plasma jets which convey cathode material with a distribution which is peaked in the direction of the anode and in all other directions. In addition, MPs are produced, which are known from the work of Daalder to have a distribution that typically is peaked at some small angle with respect to the cathode plane. Thus, initially much of the cathode material produced by the arc is deposited on the anode which is initially cool. If there is an unobstructed path from the cathode surface to a substrate, for example 152, the substrate will receive a flux of material which will include MPs, which is often undesirable.

The arc, however, heats the anode. If a sufficiently high arc current is supplied for a sufficiently long time, the anode reaches a sufficiently high temperature so that any material previously deposited on it from the cathode is evaporated and no further deposition is accumulated on it, and the production of MPs from the arc ceases. We refer to this mode of arc operation as the hot refractory anode vacuum arc (HRAVA) mode. If the flux of MPs from the initial stage of the arc when it is operating in the cathode spot mode can be prevented, then a coating will form on substrates that is substantially free of MPs. This may be accomplished by placing a shutter 150 between the arc which is sustained in the inter-electrode region 160 and the substrate or substrates, for example 152. The shutter should be closed during the initial phase of the arc, and opened only after the HRAVA mode is established. While only a single substrate is shown in FIG. 1, one skilled in the art will recognize that a multiplicity of substrates could likewise be treated, provided each was shielded by a shutter during the cathode spot mode of the arc, either by individual shutters, or with a single large shutter. In one preferred embodiment the electrodes are located in the center of a large chamber, and the substrates are arranged around the periphery of the chamber interior.

In one preferred embodiment not illustrated, the heat reflector surrounding the anode is supported independently of the anode and provided with means of controlling its axial position. During the initial cathode spot mode operation of the arc, the heat reflector is so positioned that it extends past the interelectrode gap and past the plane of the cathode, and thus blocks any radial flux to the substrates. After the HRAVA mode is established, the heat reflector is withdrawn in the direction of the anode, so that its edge is approximately even with the anode plane, and thus allows plasma from the inter-electrode region to reach the substrates. In this embodiment the heat reflector serves a double function, i.e. both as a heat reflector and as a shutter. This use of the heat reflector as a shutter would be particularly suitable when a multiplicity of substrates is arranged around the periphery of the vacuum chamber.

Figure 2:
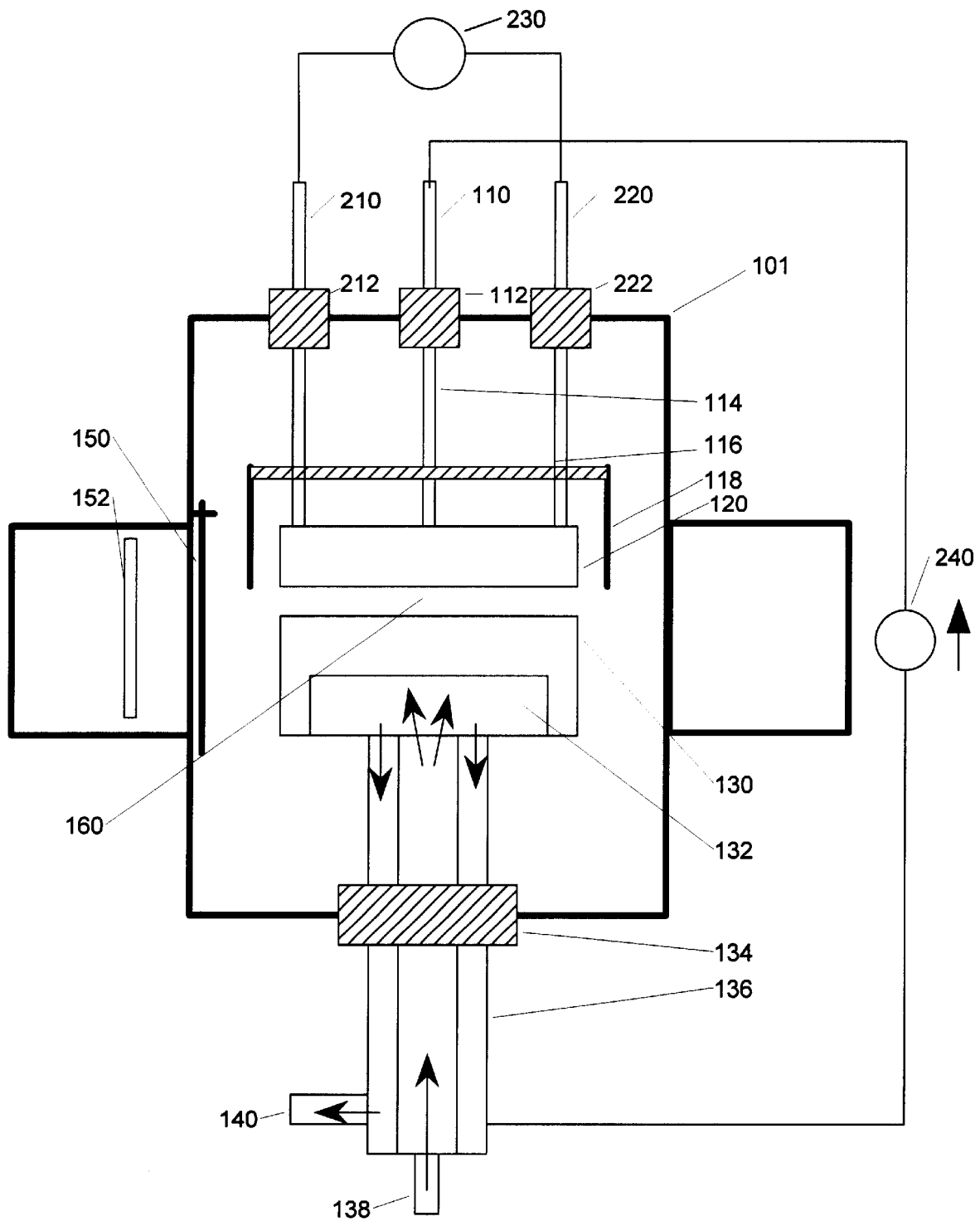
FIG. 2 is a schematic illustration of the apparatus according to an embodiment of this invention.
Figure 3:
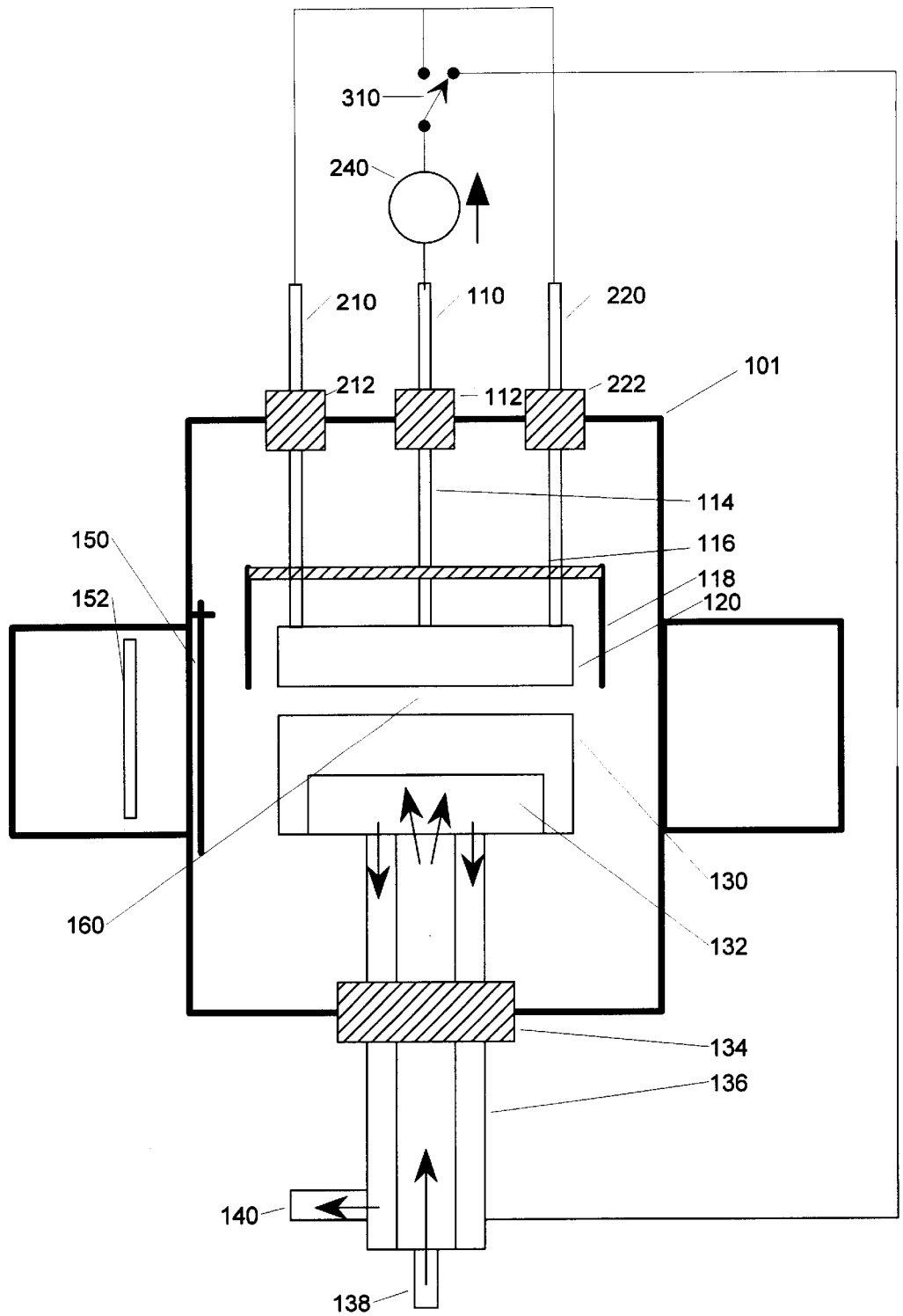
FIG. 3 is a schematic illustration of the apparatus according to another embodiment of this invention.

In another embodiment of the invention, the duration of the initial cathode spot arc mode is minimized to insignificant duration by preheating the anode to the temperature required for the HRAVA mode. This may be accomplished by any conventional means, such as using radiant or resistive heating elements, or by passing a high current directly through the anode. This latter means is illustrated in FIG. 2. Two additional connections are made to the anode 120 by means of connecting rods 210 and 220 which pass through insulated feedthroughs 212 and and 222, and are connected to an electrical power source 230. Also shown is the arc current source 240, connected between the anode and cathode. The anode heating source 230 may be AC or DC. Source 230 is energized before igniting the arc, and allowed to operate sufficient time to heat the anode to a sufficiently high temperature so that the HRAVA mode is established within a very short time after igniting the arc. In yet another embodiment of this invention, heating power is supplied to the anode at a reduced amplitude after the arc is ignited, in order to reduce the arc current required for maintaining the HRAVA mode. In a further embodiment of the invention, a single power supply 240 is used for pre-heating the anode and for operating the arc. A switching device 310 illustrated in FIG. 3 is used to transfer the connection from the current supply 240 from auxiliary anode connections 210 and 220 to the cathode connection 136 at the appropriate time. This embodiment has the advantage that only a single high current power supply is required.

Figure 4:
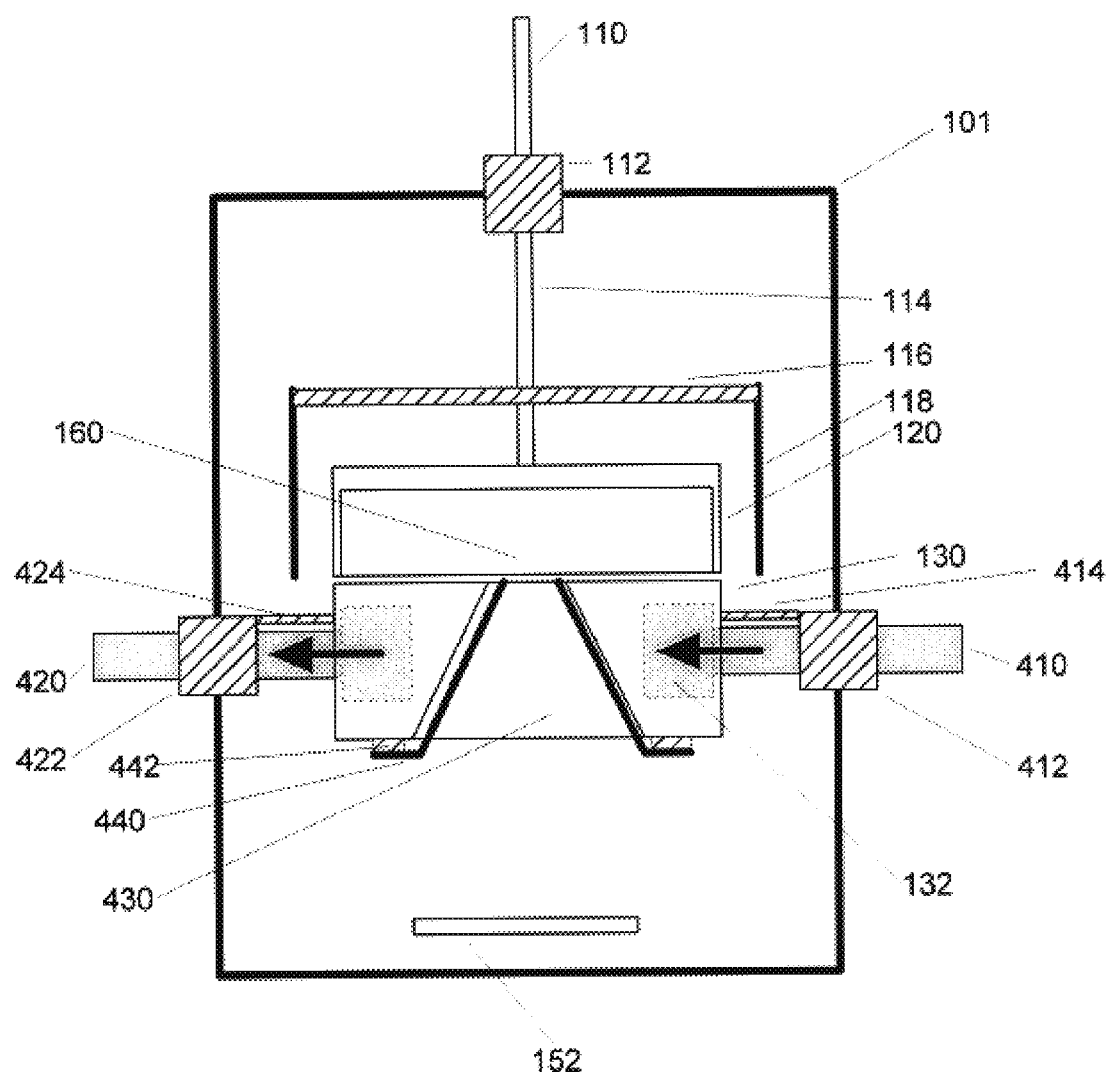
FIG. 4 is a schematic illustration of the apparatus according to a further embodiment of this invention.

In yet another embodiment of the invention illustrated in FIG. 4, the cathode is provided with an aperture 430 through which plasma may flow from the inter-electrode area 160 to a substrate 152 located behind the cathode. In a preferred embodiment aperture 430 has a conical shape. In this embodiment it is often advantageous to minimize the opening between the cathode and anode, and to hollow out the anode 120 so that most of the inter-electrode volume 160 is within this hollowed out region. The cathode 130 is provided with a water cooled cavity 132 having an annular shape.

Mechanical support, electrical connection, and cooling water is supplied to the cathode 130 via water input tube 410 and water outflow tube 420, which are insulated from the vacuum chamber by feedthroughs 412 and 422 respectively. The arrows in these parts illustrate the general direction of the water flow. In some cases it is advantageous to insulate at least those portions of the tubes 410 and 420 that generally face towards the anode with insulators 414 and 424. The aperture 430 is lined with a conical member 440, preferably constructed from a refractory material. The liner 440 is insulated from the cathode with an insulating washer 442. The objective of the conical shape of aperture 430 is to minimize plasma losses to the walls of the aperture. Liner 440 is heated by the plasma flux striking it, and reaches a temperature such that all incoming vapor flux is re-evaporated. In some embodiments, this function is enhanced by providing an additional means for heating the liner (not shown). For example, contacts may be provided for flowing an electrical current through the liner and resistively heating it. Insulating the liner 440 from the cathode 130 by the insulating washer 442 prevents the liner as acting as part of the cathode. Preferably the washer is so situated such that its surfaces are shielded from the inter-electrode region, to minimize a coating forming thereon and short-circuiting it. Thus cathode spots, if they are present, are concentrated on the top surface of the cathode, and there is no direct path between this surface and the substrate 152 — the body of the cathode effectively shields the substrates from the cathode spots. Thus there is no direct path for MPs emitted from the cathode spots to reach the substrate.

Figure 5:
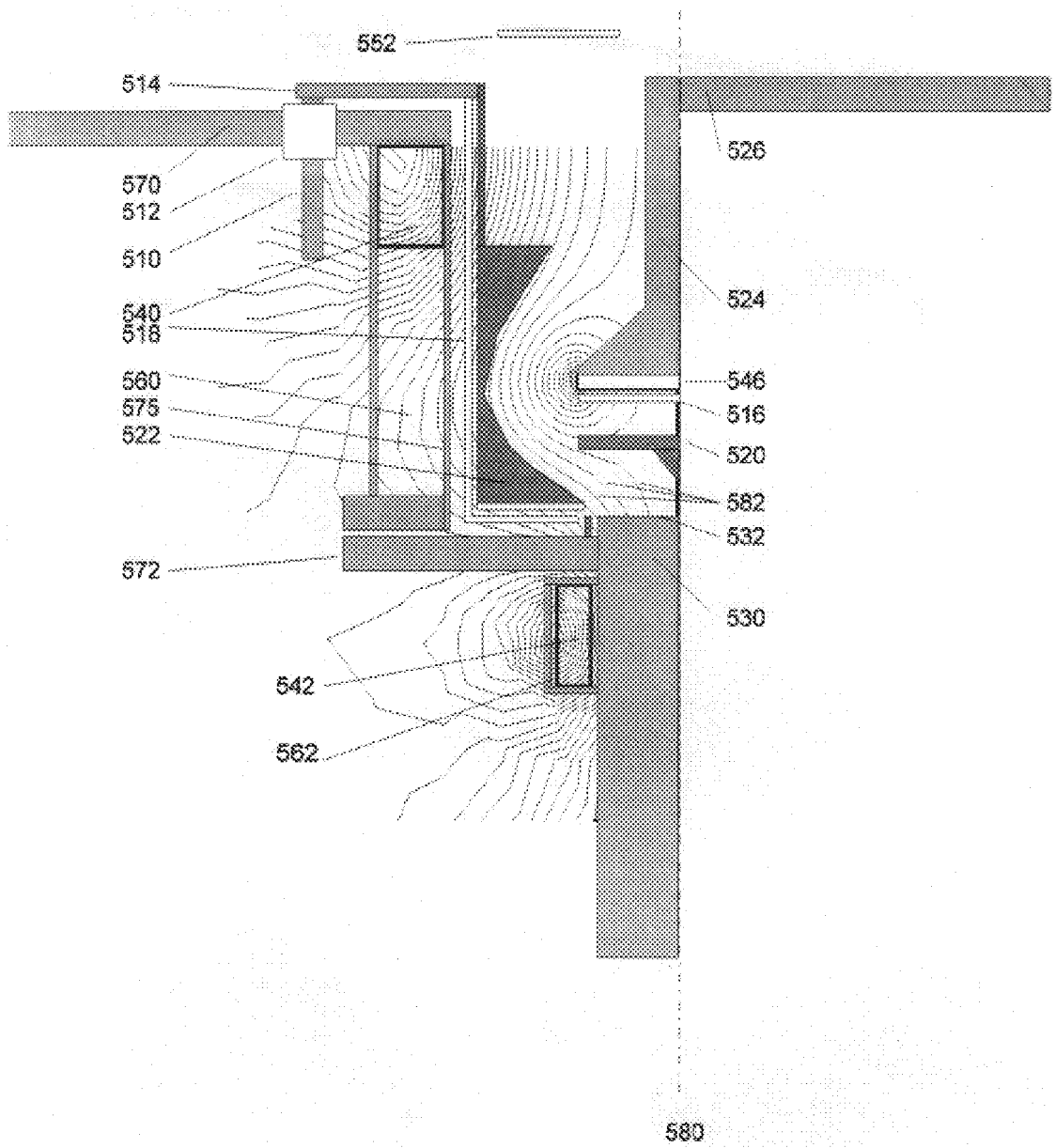
FIG. 5 is a schematic illustration of the apparatus according to a further embodiment of this invention.

A further embodiment of the invention is illustrated in FIG. 5, in which the hot refractory anode also serves as an obstacle to MP motion, while a magnetic field guides the plasma past the obstacle to the substrate. The figure is a cross-section view of the left side of an apparatus generally having cylindrical symmetry around the axis 580. Here cathode spots are generated on the surface 532 of cathode 530. The cathode is rod shaped, and in a preferred embodiment, it can be moved parallel to the axis 580 during operation. The anode has two parts: a central part 520, and a hollow part 522. Both anode parts are constructed from a refractory conducting material, e.g. graphite. A magnetic field is generated by suitable means, for example coils 540 and 542, and a permanent magnet 546. Magnetic field lines generated by these means are illustrated, and attention is drawn in particular to the lines 582, which originate on the cathode surface, and lead in the general direction of substrate 552 without intersecting the anode parts 520 and 522. The plasma flow is guided to some extent by these magnetic field lines to the substrate. Cathodic material which does reach the anode, either as vapor or MPs, will be evaporated by the high temperature of the anode, and at least partially ionized by the electrical discharge between the cathode and anode. Thus this arrangement is advantageous compared to conventional MP filters which merely trap MPs. In these conventional filters, the MP erosion component is lost to the deposition process, while in this embodiment of the invention, the MPs are vaporized and thus this material is utilized in the deposition process. Performance is enhanced in preferred embodiments of this concept by providing cooling cavities 560 and 562, which cool coils 540 and 542, respectively. A cooling fluid, e.g. water, is circulated through these cavities. Cavity 540 also cools the vacuum housing 575, and cavity 542 cools the cathode rod 530. Magnet 546 is cooled by solid conduction via rods 524 and 526. Rod 526 is not symmetric with respect to axis 580. In another embodiment, cooling is provided via fluid cooled rods. The heat flux escaping from the anode, and hence the heat load on magnet 542 and housing 580, is reduced in a preferred embodiment by heat reflectors 516 and 518. In another preferred embodiment, not illustrated here, parallel multiple heat reflectors are deployed, to further reduce the radiative heat flux. Electrical connection to the cathode rod 530 can be made at any convenient location below 542, because this portion is outside of the vacuum. Cathode rod 530 passes through flange 572. Electrical connection to the anode, as well as mechanical support for the anode, is made through conductor 510 which passes through insulating feed-thru 512 located in flange 570, and conductor 514. Elements 510, 512, and 514 are not symmetric with respect to axis 580. While one set of connections is illustrated, in some embodiments multiple connections are provided for better physical support and to produce a more symmetrical self magnetic field.

Figure 6:
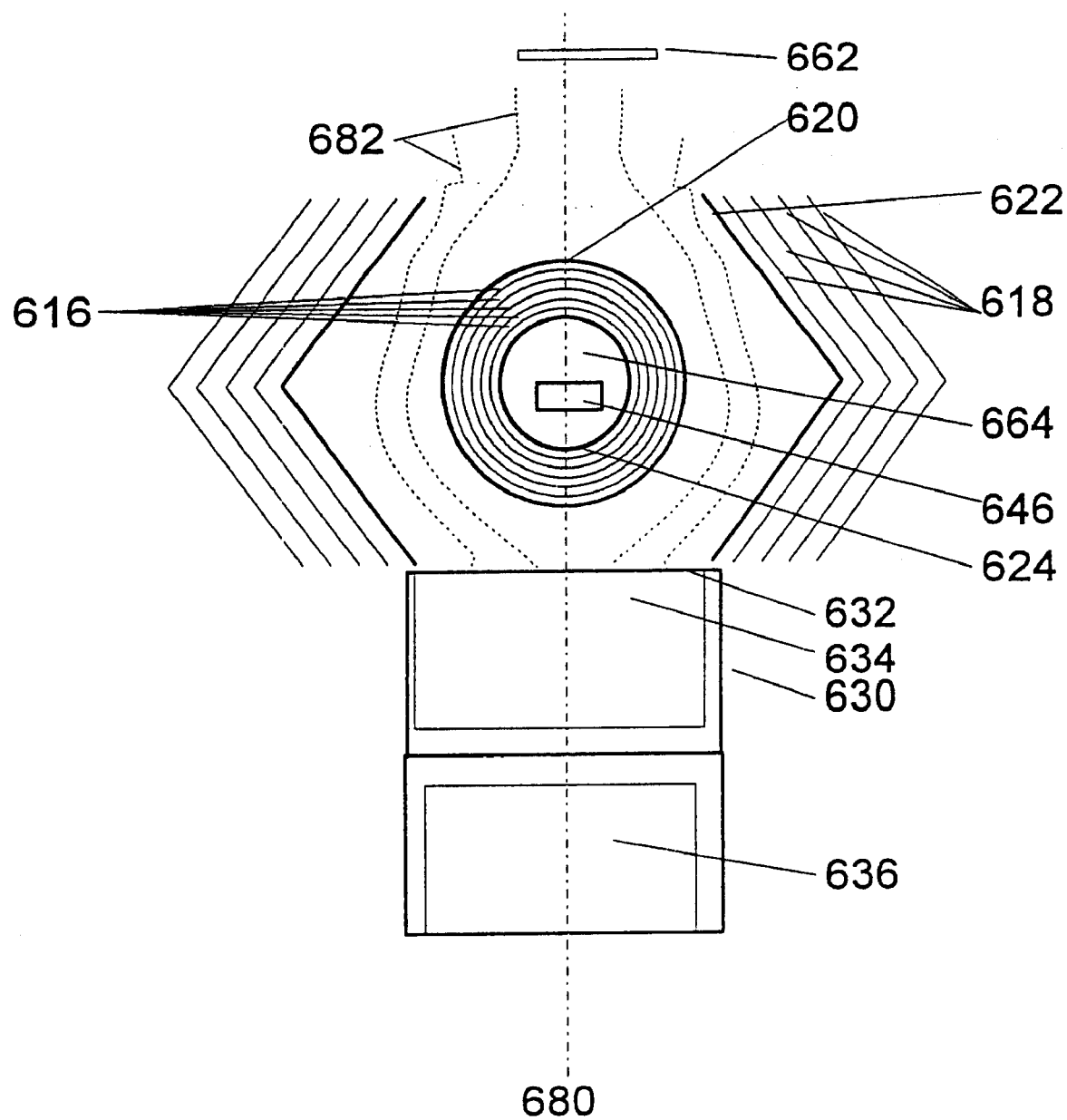
FIGS. 6 is a schematic illustration of the apparatus according to a further embodiment of this invention.

A further embodiment of the invention is illustrated in FIG. 6. This embodiment is in essence a line plasma source version of the embodiment shown in FIG. 5. FIG. 6 is a cross-section view of the interior elements of a plasma source according to the invention, where all of the parts shown extend some distance in the direction perpendicular to the plane of the paper. Vacuum walls, flanges, electrical connections, and mechanical supports, such as shown in FIG. 5, are omitted from FIG. 6 for clarity. The device is bilaterally symmetrical about the plane of symmetry represented by axis 680. In FIG. 6, the cathode 630 has a trench 634, which is filled with the coating material. For example, 630 may be copper, and 634 is filled with tin. Cathode 630 also has a hollow area 636, through which a coolant fluid may flow. The anode consists of a cylindrical hollow tube, 620, and plates 622. Outward radiation from the plates is reduced by a multiplicity of heat reflectors 618, while inward radiation from the cylinder 620 is reduced by a mulitplicity of cylindrical heat reflectors 616. A cylindrical pipe 624 is placed within the cylindrical anode - heat reflector assembly. A magnet 646 producing a field generally in the vertical direction is placed within the pipe 624. A coolant fluid is streamed in the hollow region 664 within pipe 624. This coolant fluid maintains the magnet temperature within its allowed range. Magnet 646 together with coils located above and below 646 (not shown) produce a magnetic field, of which several field lines 682 are shown. Some of these field lines pass through the cathode surface 632, around the cylindrical anode 620, and arrive at substrates such as 662, without intersecting any obstacles. On the other hand, cylindrical anode 620 blocks a direct line of flight from the cathode surface 632 to the region in which substrate 662 is located. Thus MPs produced at the cathode surface cannot arrive at the substrate directly, but rather will impact the hot anode surface. On the other hand, plasma will follow, to some extent, the magnetic field lines from the cathode spots produced by arcing on the cathode surface 632, to the substrate 662, upon which it may condense and form a coating. Depending upon the anode operating temperature, two beneficial effects may be reaped from the apparatus shown in FIG. 6. If the anode is maintained at a temperature above the cathode material melting point, MPs arrive at the anode will remain in the liquid state, and drip downwards, and eventually fall in return to the cathode. Thus the cathode material eroded as MPs is recovered and recycled to the cathode, improving the economy of the operation. At higher anode temperature, cathode material arriving at the anode is evaporated, and then partially ionized in the electrical discharge, as explained in the previous paragraph in connection with FIG. 5. The anode is heated directly by the arc discharge. In addition, auxiliary heating means may be provided. For example, electrical current may be injected to flow along the length of the elements comprising the anode, 620 and 622, in the direction perpendicular to the plane of the paper. Heating coils may be affixed to the anode, or radiant heating coils or heating lamps may be used. One skilled in the art will recognize that other variations embodying the principles set forth here may be realized. For example, different portions of the structures 620 and 622 referred to here as elements of the anode, can be maintained at different electrical potentials by connecting them to independent sources. Portions of these structures can be maintained at the plasma floating potential, or be constructed from insulating materials, while still realizing the physical principles described in this document.

EXAMPLE

Figure 7:
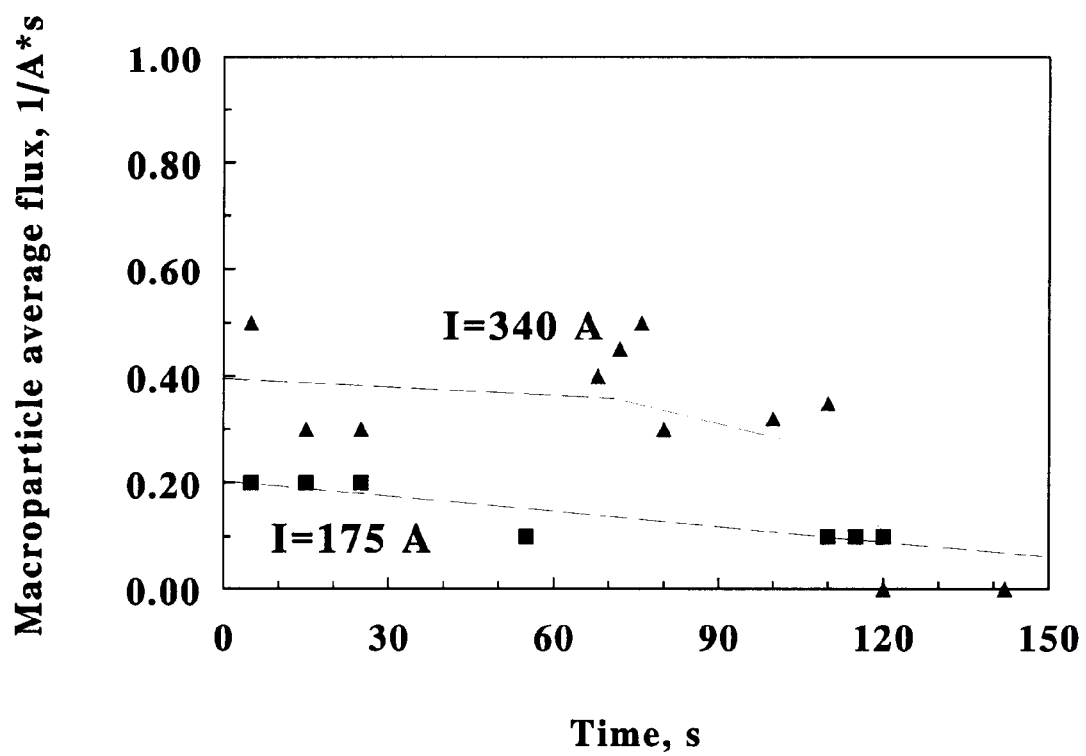
FIG. 7 is a graph presenting measured macroparticle flux as a function of time during an arc, and showing the disappearance of the macroparticle flux under certain conditions.

The operation of this invention can be better appreciated through a specific example. The apparatus in this example was constructed substantially as illustrated in FIG. 1. Vacuum chamber 101 was a cylindrical stainless steel chamber 500 mm long and 160 mm in diameter. The chamber was pumped down to a pressure $3 \cdot 10^{-5}$ Torr by an oil diffusion pump and a conventional mechanical pump, before arc initiation. The arc was run at currents of 175 and 340 A, for periods up to 160 s. The 30 mm diameter copper cylindrical cathode 130 was water-cooled. The anode 120 was a graphite cylinder (DFP-1 Poco Graphite Inc.) of 32 mm diameter and 30 mm height. In the present example the inter-electrode gap 160 was about 1 cm. Coatings were deposited on stainless steel substrates (10×10 mm) placed 15 cm from the discharge axis. The samples were cleaned by immersion in alcohol prior to mounting, and exposed to the radial flux from the arc for 10–20 s. Four substrates 152 were mounted during each run, and each substrate was equipped with a separate shutter 150. Each substrate could be thus exposed for a different portion of the arc. After the arc ceased, the substrates were removed from the chamber, and four random photomicrographs per sample were acquired using a 80× lens, and the number of macroparticles was counted to determine the MP flux. The resultant flux, as a function of time during the arc, is plotted in FIG. 7. The results shown are averages over the four photomicrographs. The average macroparticle flux F was calculated using the microscopically observed macroparticle density N on the substrates, and the exposure duration $t_e$ according to $F=N/t_e$. It can be seen that macroparticle flux decreases with time. In the case of 340 A the macroparticle flux decreased to zero at 120–130 s. In the case of the 175 A vacuum arc, the macroparticle flux decreased more moderately, by factor of 2. It may be seen from FIG. 5, that under appropriate conditions, i.e. for the geometry and materials detailed above and I=340 A and t>120 s, coatings free of MPs can be produced.

The mechanism of action of this invention, i.e. the effective elimination of MP flux, is not fully understood. The macroparticle flux apparently depends on the HRAVA operation mode, with the full HRAVA mode present in the 340 A arc after 120 s. The zero MP flux observed then can be exploited for producing MP free coatings. There are at least two possible physical reasons for the MP flux decrease. First, the plasma density in the inter-electrode gap in the fully developed HRAVA mode is greater than during the initial stages of the arc, as shown by our experimental studies and by theoretical analyses. Therefore heat flux from the plasma to the macroparticles increases, which may lead to macroparticle evaporation. Second, in the steady state HRAVA mode it is possible that macroparticle emission from the cathode decreases when the anodic plume reaches the cathode surface. The above explanation is offered in order to partially explain the underlying physics of the phenomena being exploited by this invention, but in no way does it limit the invention's scope.

One skilled in the art will recognize that many standard features necessary for the construction of a vacuum deposition system are not detailed herein, such as the means for mounting, heating, and biasing the substrates, flanges and seals on the vacuum chamber, means of evacuating the chamber, means for introducing and regulating a low pressure working gas or reactive gas, etc. These features are well known in the art. One skilled in the art will further recognize that the principles set forth above can be applied in a variety of additional modifications and variations which embody the basic invention as delineated by the claims which follow.

We claim:

1. A method of depositing thin films and coatings, comprising:

providing a deposition chamber equipped with a cooled arc cathode having a first material and a defined active surface, and a refractory thermally isolated non-consumable anode having a second material, wherein said anode is positioned to intercept a portion of said first material emitted by said cathode, and wherein said second material has a higher melting temperature than said first material, and wherein said second material has a lower equilibrium vapor pressure than said first material at every temperature in a range above the melting temperature of said first material and below the melting temperature of said second material, mounting at least one substrate in said chamber, establishing a pre-determined atmosphere within said chamber, establishing an arc discharge between said cathode and said anode such that said discharge produces vapor consisting of vaporized cathode material, heating said anode to a working temperature sufficient to remove at least some of said portion of said first material intercepted by said anode, exposing said substrate to vaporized cathode material produced by the arc.

2. The method of depositing thin films and coatings as in claim 1, further comprising confining cathode spot activity to said active surface and placing an obstruction across any line of sight between said substrate and said active surface.

3. The method of depositing thin films and coatings as in claim 2, where said obstructing is effected by placing said substrate behind said cathode and further comprising defining an inter-electrode region bordered in part by said active surface and said anode, and providing an aperture through said cathode, wherein said aperture provides a path between said substrate and said inter-electrode region.

4. The method of depositing thin films and coatings as in claim 2, wherein said placing an obstruction across said line of sight is effected by arranging said anode and said substrate so that said anode obstructs said line of sight.

5. The method of depositing thin films and coatings as in claim 4, further comprising providing a magnetic field which guides said vapor around said anode to said substrate.

6. The method of depositing thin films and coatings as in claim 4, wherein said working temperature is above the melting temperature of said cathode material, and wherein said anode is arranged such that any cathode material accumulating on said anode drips onto said cathode.

7. The method of depositing thin films and coatings as in claim 2, and further comprising removing said obstruction from said line of sight during a time when macroparticle generation rate is less than a pre-determined value.

8. The method of depositing thin films and coatings as in claim 1, further comprising heating the anode to said working temperature prior to establishing said arc discharge.

9. The method of depositing thin films and coatings as in claim 1, where said heating of said anode is effected with said arc discharge.

10. The method of depositing thin films and coatings as in claim 1, wherein said working temperature is sufficient to evaporate cathode material at a rate substantially equal to the rate at which evaporated cathode material is intercepted by said anode.

11. An apparatus for producing coatings and thin films comprising:
    a vacuum chamber,
    means for evacuating the chamber,
    a cooled consumable cathode having a first material and having a defined active surface and a defined body,
    a thermally isolated refractory non-consumable anode having a second material wherein said anode is positioned to intercept some portion of material emitted by said cathode, and wherein said second material has a higher melting temperature than said first material, and wherein said second material has a lower equilibrium vapor pressure than said first material at every temperature in a range above the melting temperature of said first material and below the melting temperature of said second material,
    an inter-electrode volume, bounded partially by said cathode and said anode,
    means for heating said anode to a pre-defined working temperature,
    an electrical connections to said cathode
    a first connection to said anode,
    a first power supply for supplying arc current, connected between said cathode and said anode,
    means for igniting an arc discharge between said cathode and said anode,
    means for mounting at least one substrate,
    a first line sight between said inter-electrode volume and said substrate,
    and means for obstructing a second line of sight between said active surface of said cathode and
    said substrate during a time that macroparticles are produced at said active surface.

12. The apparatus for producing coatings and thin films as in claim 11, and further comprising at least one heat reflector arranged to reduce thermal loss from the anode.

13. The apparatus for producing coatings and thin films as in claim 12, further comprising means to move said heat reflector during the arc discharge so that said heat reflector obstructs said second line of sight at selectable times.

14. The apparatus for producing coatings and thin films as in claim 11, wherein said first line of sight is provided by an aperture in the cathode, said substrate is mounted behind the cathode, and said second line of sight between said active surface and said substrate is obstructed by said body of said cathode.

15. The apparatus for producing coatings and thin films as in claim 11, wherein said arc includes the means for heating the anode.

16. The apparatus for producing coatings and thin films as in claim 15, wherein said means for heating the anode is comprised of at least one additional electrical connection to the anode, and a second power supply which can supply heating current to the anode.

17. The apparatus for producing coatings and thin films as in claim 16, wherein the means for heating the anode comprises said first power supply, and wherein said first power supply has a positive pole and a negative pole,
    said means for heating the anode further comprising a second electrical connection to the anode and a switching device, wherein said positive pole of said first power supply is connected to said first connection of said anode, and wherein said switching device is arranged to switch the connection from the negative pole of said first power supply between said second connection to the anode and said connection to said cathode.

18. The apparatus for producing coatings and thin films as in claim 11, wherein said means for obstructing said second line of sight comprises a shutter, and further comprises means for opening said shutter when macroparticle production is less than a pre-determined value.

19. An apparatus for producing coatings and thin films comprising:
    a vacuum chamber,
    means for evacuating the chamber,
    a cooled consumable cathode having a first material and having a defined active surface,
    means for mounting at least one substrate,
    a thermally isolated refractory non-consumable anode having a second material, wherein said anode is positioned to block all lines of sight between said active surface and said substrate and to intercept some portion of said first material emitted by said cathode, and wherein said second material has a higher melting temperature than said first material, and wherein said second material has a lower equilibrium vapor pressure than said first material at every temperature in a range above the melting temperature of said first material and below the melting temperature of said second material,
    electrical connections to said cathode and said anode,
    a power supply for supplying arc current, wherein said power supply is connected between said cathode and said anode,
    means for igniting an arc discharge between said cathode and said anode,
    means for heating said anode to a pre-defined working temperature.

20. The apparatus for producing coatings and thin films as in claim 19, further comprising means of producing a magnetic field which contains field lines connecting said active surface with said substrate without intersecting any solid objects between said active surface and said substrate.

21. The apparatus for producing coatings and thin films as in claim 19, wherein said anode is arranged such that any liquid material on said anode can flow along a surface thereof and drip onto said cathode.

22. The apparatus for producing coatings and thin films comprising as in claim 19, wherein the means for heating said anode comprises the arc discharge.

23. The apparatus for producing coatings and thin films as in claim 22, wherein said means for heating comprise connections for flowing electrical current in said anode.

24. The apparatus for producing coatings and thin films as in claim 22, wherein said means for heating are heating coils.

25. The apparatus for producing coatings and thin films as in claim 22, wherein said means for heating are radiant lamps.

* * * * *